United States Patent
Wieck

(10) Patent No.: US 12,302,676 B2
(45) Date of Patent: May 13, 2025

(54) METHOD OF JOINING A PIN TO A CAVITY AND JOINT ASSEMBLY

(71) Applicant: Hella GmbH & Co. KGaA, Lippstadt (DE)

(72) Inventor: Christian Wieck, Lippstadt (DE)

(73) Assignee: Hella GmbH & Co. KGaA, Lippstadt (DE)

( * ) Notice: Subject to any disclaimer, the term of this patent is extended or adjusted under 35 U.S.C. 154(b) by 418 days.

(21) Appl. No.: 17/805,059

(22) Filed: Jun. 2, 2022

(65) Prior Publication Data

US 2022/0293839 A1 Sep. 15, 2022

Related U.S. Application Data

(63) Continuation of application No. PCT/EP2019/084574, filed on Dec. 11, 2019.

(51) Int. Cl.
*H10H 20/857* (2025.01)
*H10H 20/01* (2025.01)

(52) U.S. Cl.
CPC .......... *H10H 20/857* (2025.01); *H10H 20/01* (2025.01)

(58) Field of Classification Search
None
See application file for complete search history.

(56) References Cited

U.S. PATENT DOCUMENTS

| 4,474,306 A | 10/1984 | Nakauchi et al. |
| 2004/0240083 A1 | 12/2004 | Yamakawa |
| 2008/0057305 A1* | 3/2008 | Grose .................. B29C 66/112 264/261 |

FOREIGN PATENT DOCUMENTS

WO 2017180060 A1 10/2017

* cited by examiner

*Primary Examiner* — Michelle Mandala
*Assistant Examiner* — Jordan M Klein
(74) *Attorney, Agent, or Firm* — Husch Blackwell LLP

(57) ABSTRACT

A method is provided to fasten a pin in a target position extending at least partially into a cavity with a distance (D) between a bottom surface of the cavity and a facing end of the pin. The pin is positioned at the target position, and the distance (D) is determined between the bottom surface of the cavity and the facing end of the pin in the target position. The pin is removed from the cavity, and a rigid spacer is applied on the bottom surface. A thickness of the rigid spacer equals the distance (D) between the bottom surface and the facing end of the pin in the target position. The adhesive is filled into the cavity onto the rigid spacer, and the pin is repositioned at the target position. The adhesive is then cured to obtain a joint between the pin and the second component.

8 Claims, 4 Drawing Sheets

METHOD OF JOINING A PIN TO A CAVITY AND JOINT ASSEMBLY

CROSS-REFERENCE TO RELATED APPLICATIONS

This application claims priority to and is a continuation of PCT Application No. PCT/EP2019/084574, filed Dec. 11, 2019, the entirety of which is hereby incorporated by reference in its entirety.

FIELD OF THE INVENTION

The present invention relates to a method of joining a pin member of a first component to a second component with a cavity by means of an adhesive in order to fasten the pin in a target position extending at least partially into the cavity with a distance between the bottom surface of the cavity and the facing end of the pin. The invention further relates to a corresponding joint assembly.

BACKGROUND OF THE INVENTION

Precise adjustment of light sources and optical components, e.g. lenses, reflectors or optical waveguides, relative to each other is a key challenge in assembling lighting devices of motor vehicles. During mounting of the light source group and/or related optical components on a carrier of the lighting device, e.g. a platform or a holding frame, their relative positions are varied by a manipulator while the light source is operated and the resulting lighting effect is monitored. The target position of the components is then finally defined by the constitution of a desired target lighting effect. The fixation of the components in this target position is usually established by adhesive joints, especially between pin members of the first component and associated cavities of the carrier.

A major issue concerning such adhesive joints is the effect of volumetric shrinkage of the adhesive during curing, caused e.g. by the evaporation of a solvent or by a cross-linking reaction. This shrinkage effect yields a subsequent alteration of the adjusted position of the light source or optical component and therefore a potentially critical deterioration of the lighting effect generated by the lighting device.

In an exemplary process, a cavity of the carrier is filled with a flowable adhesive and the optical component is held and positioned by a manipulator so that a pin member of the optical component at least partially extends into the cavity and the adhesive. During the following fine adjustment of the optical component relative to an operating light source, the displacements of the pin remain confined to the cavity, e.g. the cavity exhibits a depth of 9 mm, the pin exhibits a length of >9 mm and the displacement range of the pin in a vertical direction, i.e. along its longitudinal axis, during the fine adjustment amounts to about 1 mm. The shrinkage of a conventional ultraviolet (UV)-light curable adhesive then typically yields an undesired subsidence of the pin during curing on the order of 100 µm in the vertical direction.

In the context of a lighting device for a motor vehicle, such shifts along the vertical axis are most disadvantageous, because they strongly affect the position of the light cut-off line projected onto the road, which represents a key performance criterion of the lighting device subject to strict regulations and customer specifications.

The document EP 1 690 906 B1 teaches a method for gluing two workpieces with an adhesive, wherein after adjustment of the workpieces connecting parts wetted with a fixing glue are placed against appropriate surfaces, so that the connecting parts are in contact with both workpieces and support the workpieces during curing of the adhesive.

BRIEF SUMMARY OF THE INVENTION

It is an object of the present invention to provide a method of joining a pin member of a first component to a second component with a cavity by means of an adhesive in order to fasten the pin in a target position extending at least partially into the cavity with a distance between the bottom surface of the cavity and the facing end of the pin, wherein the method especially comprises measures to prevent the pin from repositioning towards the bottom surface of the cavity during curing of the adhesive.

The invention discloses the technical teaching that the method of joining comprises at least the following steps: positioning the pin to the target position; determining the distance between the bottom surface of the cavity and the facing end of the pin in the target position; removing the pin out of the cavity; applying a rigid spacer on the bottom surface of the cavity, wherein the thickness of the rigid spacer equals the distance between the bottom surface of the cavity and the facing end of the pin in the target position; filling the adhesive into the cavity; repositioning the pin to the target position; curing the adhesive and obtaining a joint between the pin and the second component.

In an embodiment of the invention, a spacer is used filling the space between the bottom surface of the cavity and the facing end of the pin, thus eliminating basically any adhesive from the volume below the pin. The joint between the pin and the second component is constituted by the adhesive surrounding the circumferential surface of the pin. The shrinkage of the adhesive during curing therefore can only affect the horizontal position of the pin, which is much less critical regarding the aforementioned use in a lighting device, but the spacer prevents the pin from any repositioning towards the bottom surface of the cavity.

Due to its rigidity, the spacer cannot be deformed by the load applied by the first component via the pin. The rigid spacer is formed for instance by an appropriate plastic, e.g. a thermosetting polymer. In a typical application of the inventive method, the target position of the pin and therefore the required thickness of the spacer is unknown a priori. The required thickness of the spacer can only be determined after positioning of the pin in the target position and determination of the distance between the bottom surface of the cavity and the facing end of the pin in the target position. The inventive method thus may comprise an additional step of machining a dummy slice to a spacer of dedicated thickness equal to the distance between end of the tip and bottom surface of the cavity in the target position of the pin.

As a preferred embodiment of the invention the first component is chosen from a light source group or from an optical component associated with a light source and the second component is chosen from a carrier, wherein during positioning the pin inside the cavity the light source is operated and a resulting lighting effect is monitored in order to locate the target position by the constitution of a target lighting effect. The invention was motivated by this application and yields a major benefit over prior art joining methods in this context.

Advantageously, the rigid spacer is formed by a slice of cured adhesive, wherein applying the rigid spacer comprises the following steps: filling an adhesive into the cavity, wherein the amount of the adhesive is dedicated to obtain a thickness of the cured adhesive equal to the distance between the bottom surface of the cavity and the facing end of the pin in the target position; curing the adhesive and obtaining the rigid spacer positioned on the bottom surface of the cavity.

For ease of practical operation, the adhesive used to form the spacer preferably equals the adhesive used for the joint between the pin and the second component, but differing types of adhesives are in principle equally appropriate. The amount of shrinkage during curing of the adhesive used to build the spacer must be calculated and the amount of adhesive filled into the cavity must be dosed accordingly, so that after curing the thickness of the cured adhesive, i.e. the thickness of the rigid spacer, equals the distance between the bottom surface of the cavity and the facing end of the pin in the target position.

In a preferred embodiment of the inventive method, the distance between the bottom surface of the cavity and the facing end of the pin in the target position is determined by means of laser scanning. Laser scanning is a convenient technique to generated quantitative 3D-models of component assemblies and allows for a proper determination of the positioning of the first and the second component and thus of the detailed distance between the bottom surface of the cavity and the facing end of the pin in the target position.

Advantageously, the adhesive used for the joint between the pin and the cavity and/or the adhesive used to form the rigid spacer are chosen from an UV-light curing type.

These adhesives allow for a fast and technically simple curing process compared to the use of heat-curable adhesives.

According to another preferred embodiment of the invention the first component is chosen from a light source group or from an optical component of a lighting device of a motor vehicle and the second component is chosen from a carrier of the lighting device. The optical component is for instance represented by a reflector, which is mounted on a mounting platform and adjusted to a target position relative to a fixed light source of a vehicle head light.

Furthermore, the invention concerns a joint assembly at least comprising a first component with a pin member and a second component with a cavity, wherein the pin extends at least partially into the cavity and a joint between the pin and the second component is formed by an adhesive inside the cavity, characterised in that a rigid spacer is positioned between the bottom surface of the cavity and the facing end of the pin.

Such joint assembly is advantageously established by the inventive joining method and in a preferred embodiment the thickness of the rigid spacer equals the distance between the bottom surface of the cavity and the facing end of the pin.

BRIEF DESCRIPTION OF THE DRAWINGS

Reference is now made more particularly to the drawings, which illustrate the best presently known mode of carrying out the invention and wherein similar reference characters indicate the same parts throughout the views.

DETAILED DESCRIPTION OF THE INVENTION

Figure 1:
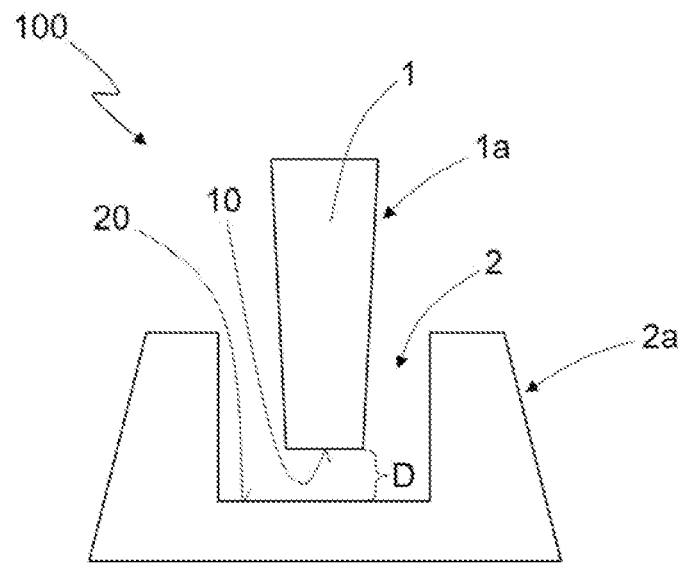
FIG. 1 illustrates the first step of an example method.

The Figures show schematic illustrations of the seven steps 100 to 700 of the inventive method to yield an embodiment of the inventive joint assembly 800, depicted in cross-sectional representation. The pin 1 is a member of a first component 1a, for instance an optical component to be positioned most accurately relative to a light source of a lighting device of a motor vehicle, and the second component 2a exhibits a cavity 2 to receive the pin 1. In the depicted example, the pin 1 is formed by a cone with a flat end 10 and the cavity 2 exhibits a cylindrical volume, whereat matching pin-cavity combinations of differing shapes can be equally appropriate for the invention on hand.

FIG. 1 shows the pin 1 in the target position extending partially into the cavity 2 with the distance D between the bottom surface 20 of the cavity 2 and the facing end 10 of the pin 1. Positioning 100 the pin 1 to this target position represents the first step of the inventive method. In the central application of the inventive method for mounting an optical component 1a relative to the light source of a vehicle lighting device, the target position is unknown a priori, because of manufacturing tolerances in the dimensions of the components 1a, 2a and other involved components. Therefore, during positioning 100 the optical component 1a the light source is operated and the resulting lighting effect is monitored, and the positioning 100 is only terminated if a desired target lighting effect is reached. It is the central task of the present invention to fasten the pin 1 in this target position inside the cavity 2 by means of a bonding process based on an adhesive, wherein during the curing of the adhesive the distance between the bottom surface 20 and the end 10 remains right at its target value D.

Figure 2:
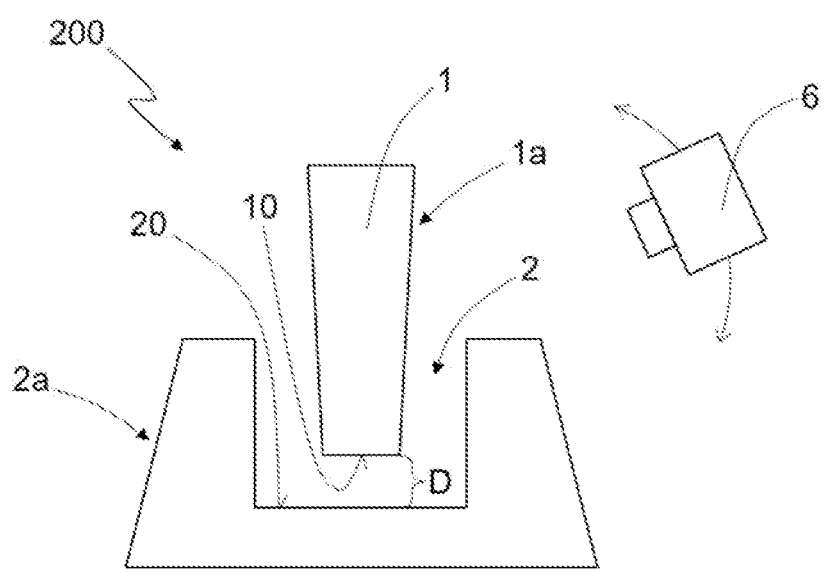
FIG. 2 illustrates the second step.

FIG. 2 illustrates the second step of the inventive method, namely determining 200 the distance D between the bottom surface 20 of the cavity 2 and the facing end 10 of the pin 1 in the target position. This task is performed with the laser scanner 6, which is developed to generate a quantitative 3D-model of the assembly of the components 1a and 2a.

Figure 3A:
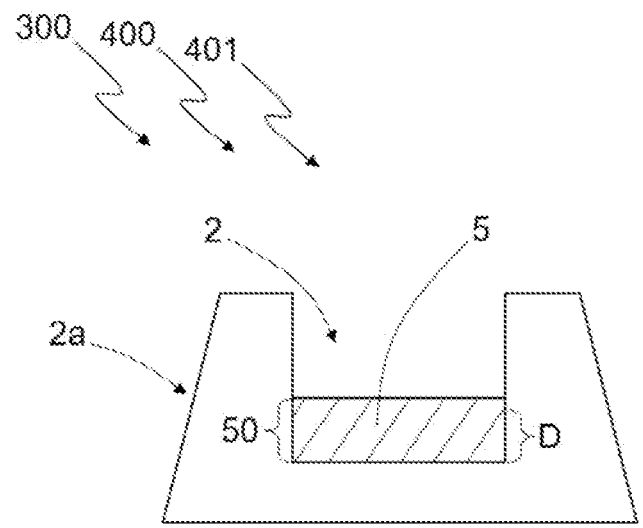
FIGS. 3a and 3B illustrate the third step.
Figure 3B:
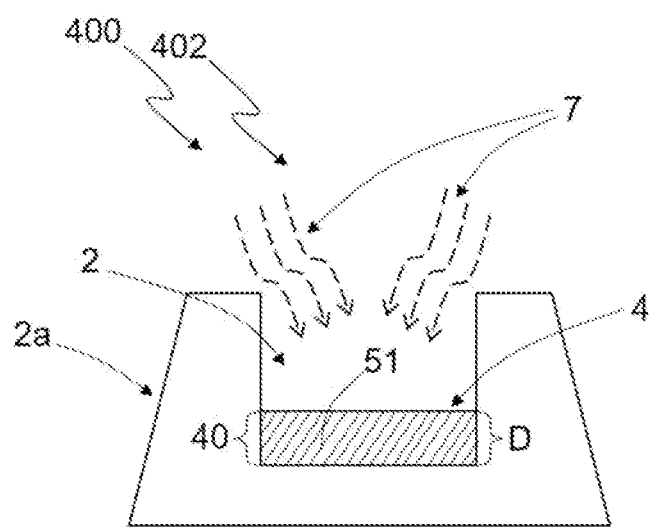

The FIGS. 3a,b illustrate a preferred embodiment of the fourth step of the inventive method after removing 300 the pin out of the cavity, namely applying 400 a rigid spacer 4 on the bottom surface of the cavity 2, wherein the thickness 40 of the rigid spacer 4 equals the target distance D. Beforehand, In the present embodiment, the spacer 4 consists of the UV-light curable adhesive 5 and it is applied by the steps of filling 301 the adhesive 5 into the cavity 2 and subsequent curing 302 of the adhesive 5 by irradiation with UV light 7. Therein, the thickness 50 of the layer of adhesive 5 in its pourable, uncured state is dosed to such an amount that the shrinkage of the adhesive 5 during curing 302 is anticipated, so that the layer of cured adhesive 51 representing the spacer 4 exhibits the required thickness 40 equal to the target distance D.

Figure 4:
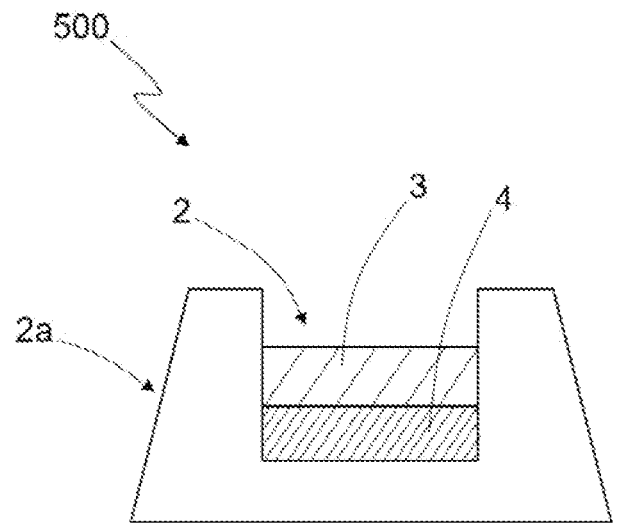
FIG. 4 illustrates the fourth step.

FIG. 4 illustrates the fifth step of the inventive method, namely filling 500 the adhesive 3 into the cavity 2 onto the rigid spacer 4. The pourable adhesive 3 preferably consists of an UV-light curable resin, alternatively, if the cavity 2 is not sufficiently accessible for illumination, a heat-curable type of adhesive can be deployed.

Figure 5:
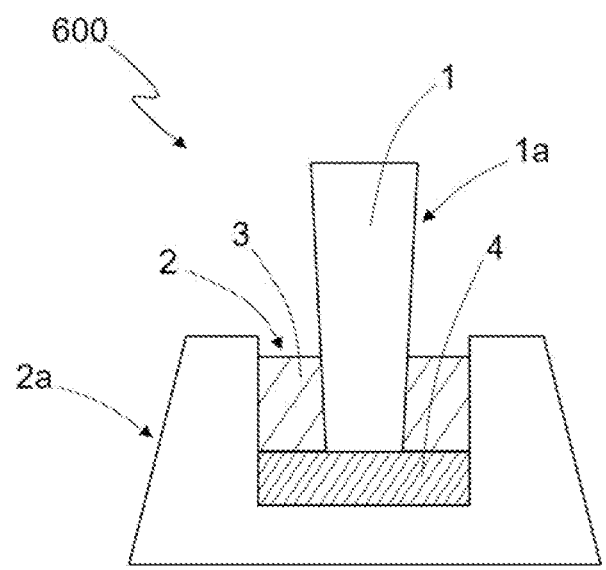
FIG. 5 illustrates the fifth step.

FIG. 5 illustrates the sixth step of the inventive method, namely repositioning 600 the pin 1 to the target position. At this stage of the process, the target position is well-known and for instance defined by a set of coordinates assigned to the manipulator, which is deployed for handling of the first component 1a. The bottom section of the pin 1 is dipped into the flowable adhesive 3 and placed on the rigid spacer 4. Except for an insignificant amount of residual adhesive 3 on the mating surfaces of the pin 1 and the spacer 4, the volume of the cavity 2 below the pin 1 in this assembly is free of adhesive 3.

Figure 6:
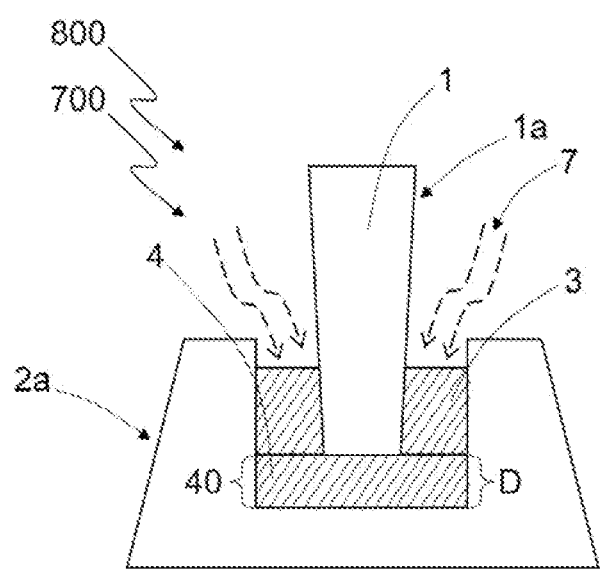
FIG. 6 illustrates the sixth step, as well as an example joint assembly.

FIG. 6 illustrates the inventive joint assembly 800 and the last step of the inventive method, namely curing 700 the adhesive 3 and obtaining a joint between the pin 1 and the second component 2*a*. To this end, the adhesive 3 is irradiated by UV-light 7, which typically yields a crosslinking reaction within the adhesive 3 and a related hardening effect. The adhesive joint is established between the circumferential sections of the pin 1 and the cavity 2 inside the component 2*a*. The volume of the cavity 2 below the pin 1 is filled by the rigid spacer 4 and thus basically free of any adhesive 3. This represents the key innovation of the present invention, because in such an assembly, the shrinkage of the adhesive 3 during curing 700 does not affect the vertical position of the pin 1, so that the end of the pin 1 remains unaltered at the target distance D above the bottom surface of the cavity 2. Furthermore, the friction between the mating surfaces of the pin 1 and the rigid spacer 4 contributes to a certain fixation of the pini during curing 700 also in the horizontal plane.

Therefore, the inventive method of joining enables to build a highly precise joint assembly 800 of an optical component 1*a* in a carrier 2*a* relative to a light source as parts of a vehicle lighting device.

The present invention is not limited by the embodiment described above, which is represented as an example only and can be modified in various ways within the scope of protection defined by the appending patent claims.

LIST OF NUMERALS

1 pin
10 end of pin
1*a* first component
2 cavity
20 bottom surface of cavity
2*a* second component
3 adhesive
4 spacer
40 thickness of spacer
5 adhesive
50 thickness of uncured adhesive layer
51 cured adhesive
6 laser scanner
7 UV light
D distance
100 positioning of pin
200 determining of distance
300 removing of pin
400 positioning of spacer
401 filling of adhesive
402 curing of adhesive
500 filling of adhesive
600 repositioning of pin
700 curing of adhesive
800 joint assembly

I claim:

1. A method of joining a pin member of a first component to a second component via an adhesive, where the second component has a cavity, to fasten the pin in a target position extending at least partially into the cavity with a distance (D) between a bottom surface of the cavity and a facing end of the pin, the method comprising the steps of:
    positioning the pin in the target position;
    determining the distance (D) between the bottom surface of the cavity and the facing end of the pin in the target position;
    removing the pin from the cavity;
    applying a rigid spacer on the bottom surface of the cavity, wherein a thickness of the rigid spacer equals the distance (D) between the bottom surface of the cavity and the facing end of the pin in the target position;
    filling the adhesive into the cavity onto the rigid spacer,
    repositioning the pin at the target position; and
    curing the adhesive to obtain a joint between the pin and the second component.

2. The method according to claim 1, wherein the first component is chosen from a light source group or from an optical component associated with a light source, and the second component is chosen from a carrier,
    wherein during positioning of the pin inside the cavity, the light source is operated and a resulting lighting effect is monitored in order to locate the target position by the constitution of a target lighting effect.

3. The method according to claim 1, wherein the rigid spacer is formed by a slice of cured adhesive, wherein applying the rigid spacer comprises the following steps:
    filling an adhesive into the cavity, wherein an amount of the adhesive is determined to obtain a thickness of the cured adhesive equal to the distance (D) between the bottom surface of the cavity and the facing end of the pin in the target position,
    curing the adhesive and obtaining the rigid spacer positioned on the bottom surface of the cavity.

4. The method according to claim 3, wherein the adhesive used for the joint between the pin and the cavity and/or the adhesive used to form the rigid spacer consist of an ultraviolet-light curing type.

5. The method according to claim 1, wherein the distance (D) between the bottom surface of the cavity and the facing end of the pin in the target position is determined by means of laser scanning.

6. The method according to claim 1, wherein the first component is chosen from a light source group or from an optical component of a lighting device of a motor vehicle, and the second component is chosen from a carrier of the lighting device.

7. A joint assembly comprising:
    a first component with a pin member;
    a second component with a cavity, wherein the pin member extends at least partially into the cavity and a joint between the pin member and the second component is formed by an adhesive inside the cavity; and
    a rigid spacer positioned between a bottom surface of the cavity and a facing end of the pin member,
    wherein the rigid spacer is formed from a UV-light curable adhesive.

8. The joint assembly according to claim 7, wherein a thickness of the rigid spacer equals a distance (D) between the bottom surface of the cavity and the facing end of the pin.

* * * * *